United States Patent
Bloom (10) Patent No.: US 7,180,186 B2
(45) Date of Patent: Feb. 20, 2007

(54) BALL GRID ARRAY PACKAGE

(75) Inventor: Terry R. Bloom, Elkhart, IN (US)

(73) Assignee: CTS Corporation, Elkhart, IN (US)

( * ) Notice: Subject to any disclaimer, the term of this patent is extended or adjusted under 35 U.S.C. 154(b) by 69 days.

(21) Appl. No.: 10/631,569

(22) Filed: Jul. 31, 2003

(65) Prior Publication Data

US 2005/0024839 A1 Feb. 3, 2005

(51) Int. Cl.
*H01L 23/48* (2006.01)
*H01L 23/52* (2006.01)
*H01L 29/40* (2006.01)
*H01L 21/44* (2006.01)
*B31K 31/00* (2006.01)

(52) U.S. Cl. .................. 257/738; 228/180.22; 438/614; 257/E23.021; 257/E23.069; 257/E21.508

(58) Field of Classification Search ........... 228/180.22; 257/737, 738; 438/613–617
See application file for complete search history.

(56) References Cited

U.S. PATENT DOCUMENTS

| | | | |
|---|---|---|---|
| 3,280,378 A | 10/1966 | Brady | |
| 3,346,774 A | 10/1967 | Brady | |
| 3,492,536 A | 1/1970 | Girolamo | |
| 3,849,757 A | 11/1974 | Khammous | |
| 4,225,468 A | 9/1980 | Donohue | |
| 4,300,115 A | 11/1981 | Ansell | |
| 4,332,341 A | 6/1982 | Minetti | |
| 4,626,804 A | 12/1986 | Risher | |
| 4,654,628 A | 3/1987 | Takayanagi | |
| 4,658,234 A | 4/1987 | Takayanagi | |
| 4,712,161 A | 12/1987 | Pryor | |
| 4,757,610 A | 7/1988 | McElheny | |
| 4,759,491 A | 7/1988 | Fisher | |
| 4,791,473 A | 12/1988 | Phy | |
| 4,933,741 A | 6/1990 | Schroeder | |
| 4,945,399 A | 7/1990 | Brown | |
| 4,992,628 A | 2/1991 | Beppu | |
| 5,029,325 A | 7/1991 | Higgins | |
| 5,140,407 A | 8/1992 | Kamada | |
| 5,142,351 A | 8/1992 | Matta | |
| 5,216,404 A | 6/1993 | Nagai | |
| 5,220,199 A | 6/1993 | Owada | |

(Continued)

FOREIGN PATENT DOCUMENTS

EP    0924755 A2    6/1999

(Continued)

*Primary Examiner*—David E. Graybill
(74) *Attorney, Agent, or Firm*—Mark P. Bourgeois (57) ABSTRACT

A ball grid array package includes a substrate with a top and bottom surface. A circuit component is located on the bottom surface. The circuit component has a pair of ends. A pair of conductors are located on the bottom surface. The conductors are connected to the ends of the circuit component. A conductive epoxy covers a portion of the conductors and a portion of the bottom surface. The conductive epoxy is in electrical contact with the conductors. A ball is connected to the conductive epoxy. The conductive epoxy provides an electrical connection between the conductor and the ball. The ball is preferably copper and is subsequently coated to prevent corrosion. Other embodiments of the invention are shown in which the balls are omitted and in which the conductive epoxy is used to fill vias in a substrate.

10 Claims, 8 Drawing Sheets

U.S. PATENT DOCUMENTS

| | | |
|---|---|---|
| 5,255,839 A | 10/1993 | Da Costa Alves |
| 5,272,590 A | 12/1993 | Hernandez |
| 5,352,926 A | 10/1994 | Andrews |
| 5,371,405 A | 12/1994 | Kagawa |
| 5,379,190 A | 1/1995 | Hanamura |
| 5,382,827 A | 1/1995 | Wang |
| 5,400,220 A | 3/1995 | Swamy |
| 5,420,460 A | 5/1995 | Massingill |
| 5,424,492 A | 6/1995 | Petty |
| 5,450,055 A | 9/1995 | Doi |
| 5,450,290 A * | 9/1995 | Boyko et al. ............... 361/792 |
| 5,467,252 A | 11/1995 | Nomi |
| 5,468,681 A * | 11/1995 | Pasch ..................... 438/108 |
| 5,491,303 A | 2/1996 | Weiss |
| 5,509,200 A | 4/1996 | Frankeny |
| 5,528,083 A | 6/1996 | Malladi |
| 5,530,288 A | 6/1996 | Stone |
| 5,539,186 A | 7/1996 | Abrami |
| 5,557,502 A | 9/1996 | Banerjee |
| 5,559,363 A | 9/1996 | Immorlica |
| 5,574,630 A | 11/1996 | Kresge |
| 5,607,883 A | 3/1997 | Bhattacharya |
| 5,621,619 A | 4/1997 | Seffernick |
| 5,629,838 A | 5/1997 | Knight |
| 5,635,767 A | 6/1997 | Wenzel |
| 5,636,099 A | 6/1997 | Sugawara |
| 5,661,450 A | 8/1997 | Davidson |
| 5,726,485 A | 3/1998 | Grass |
| 5,729,438 A | 3/1998 | Pieper |
| 5,745,334 A | 4/1998 | Hoffarth |
| 5,760,662 A | 6/1998 | Kalb |
| 5,766,670 A * | 6/1998 | Arldt et al. .................... 427/8 |
| 5,796,038 A | 8/1998 | Manteghi |
| 5,796,587 A | 8/1998 | Lauffer |
| 5,821,624 A * | 10/1998 | Pasch ..................... 257/776 |
| 5,870,274 A | 2/1999 | Lucas |
| 5,903,050 A | 5/1999 | Thurairajaratnam |
| 5,923,077 A | 7/1999 | Chase |
| 5,977,863 A | 11/1999 | Bloom |
| 6,005,777 A | 12/1999 | Bloom |
| 6,097,277 A | 8/2000 | Ginn |
| 6,159,304 A | 12/2000 | Noguchi |
| 6,180,881 B1 | 1/2001 | Isaak |
| 6,184,475 B1 | 2/2001 | Kitajima |
| 6,189,203 B1 | 2/2001 | Heinrich |
| 6,194,979 B1 | 2/2001 | Bloom |
| 6,246,312 B1 | 6/2001 | Poole |
| 6,264,862 B1 * | 7/2001 | Liaw ..................... 264/102 |
| 6,310,301 B1 | 10/2001 | Heinrich |
| 6,326,677 B1 | 12/2001 | Bloom |
| 6,440,228 B1 | 8/2002 | Taguchi |
| 6,897,761 B2 * | 5/2005 | Ernsberger et al. ......... 338/309 |
| 6,933,596 B2 * | 8/2005 | Hathaway et al. .......... 257/678 |

FOREIGN PATENT DOCUMENTS

| | | |
|---|---|---|
| JP | 08222656 A | 8/1996 |
| WO | WO97/30461 | 8/1997 |

* cited by examiner

BALL GRID ARRAY PACKAGE

BACKGROUND

1. Field of the Invention

This invention generally relates to a package for electronic components. Specifically, the invention relates to a ball grid array for making electrical connections in an electronic component.

2. Description of the Related Art

Many electronic packages utilize a via to connect one level or layer of circuitry to another. A via is a hole or aperture that is filled with a conductive compound to provide an electrical connection between different planes of a package allowing one side to be electrically connected to another.

The via after processing needs to be very flat in order for subsequent processing steps to succeed. The ends of the via need to be flat and not have a protrusion or a depression. The via also needs to adhere to the side walls of the via hole and not pull away from it after processing.

Prior art vias have suffered from excessive shrinkage during processing that cause depressions to form in the end of the via. The prior art compositions also can cause the via fill material to pull away from the side wall of the via hole resulting in an open circuit.

Ball grid array packages are also well known in the prior art. Typically a solder ball is used to connect between a substrate and a printed circuit board. When used with a ball grid array, ball pads are required to be placed around the vias. A solder paste is placed onto the ball pad with a solder ball and reflowed in an oven. The ball pad allows the solder to spread out around the ball making a uniform connection. The ball pad also helps to spread out the forces that the solder joint sees during thermal cycles ensuring a reliable connection over the life of the package.

Unfortunately, the use of the ball pad takes up valuable real estate and results in a less dense package that contains few connections per unit area. The ball pad also requires additional process steps to fabricate during manufacturing. Purchasing substrates with holes for an electronic package is more expensive than those without holes. It is desirable to have a high density ball grid array package that can eliminate the expense of the holes.

Another problem with prior art electronic packages is that they use lead. Lead is most commonly used in solder to make interconnections between various electronic components. Lead is a known poison to humans and several efforts by government agencies have been proposed to ban its use in electronics. It is desirable to have an electronic package that eliminates the need for lead.

Another problem with prior art electronic packages is that they are susceptible to shorting due to silver migration. Silver migration is the ionic movement of silver in the presence of moisture and an electronic potential. The silver forms a dendrite which can grow until it reaches another conductor causing a short. After the short occurs, the dendrite typically opens due to resistance heating. Silver compositions such as thick film conductors, conductive epoxies and conductive adhesives are known to suffer from silver migration problems.

A current unmet need exists for a ball grid array package that overcomes the deficiencies of the prior art.

SUMMARY

It is a feature of the invention to provide a ball grid array package for electronic components.

Another feature of the invention is to provide a ball grid array that includes a substrate with a top and bottom surface. A circuit component is located on the bottom surface. The circuit component has a pair of ends. A pair of conductors are located on the bottom surface. The conductors are connected to the ends of the circuit component. A conductive epoxy covers a portion of the conductors and a portion of the bottom surface. The conductive epoxy is in electrical contact with the conductors. A ball is connected to the conductive epoxy. The conductive epoxy provides an electrical connection between the conductor and the ball. The ball is preferably copper and is subsequently coated to prevent corrosion.

Another embodiment of the invention uses the conductive epoxy to fill vias in a substrate.

Yet another embodiment of the invention omits the ball and uses the conductive epoxy as a termination bump.

It is noted that the drawings of the invention are not to scale. The description of the invention may contain, for example, such descriptive terms as up, down, top, bottom, right or left. These terms are meant to provide a general orientation of the parts of the invention and are not meant to be limiting as to the scope of the invention.

DETAILED DESCRIPTION

Figure 1:
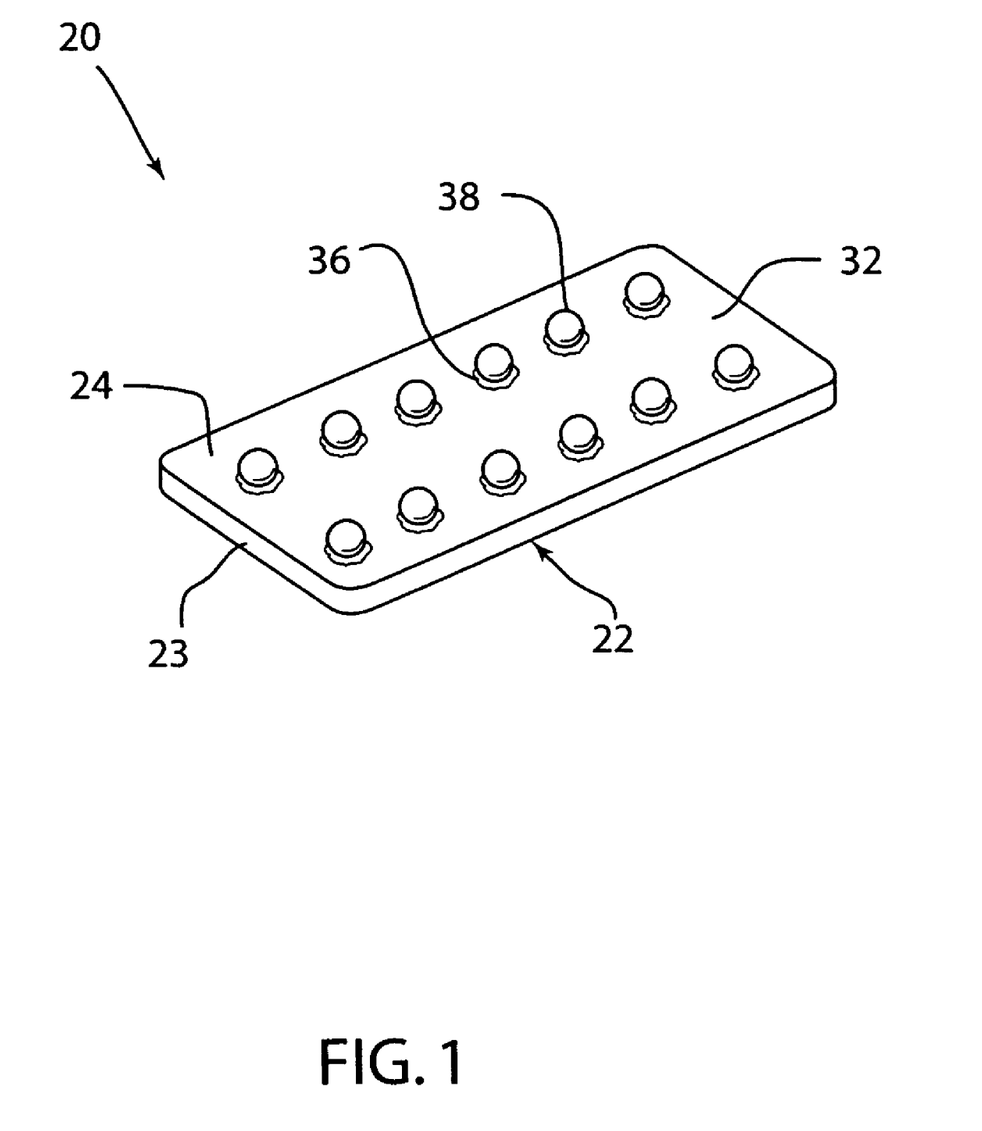
FIG. 1 is a perspective view of a ball grid array package.
Figure 2:
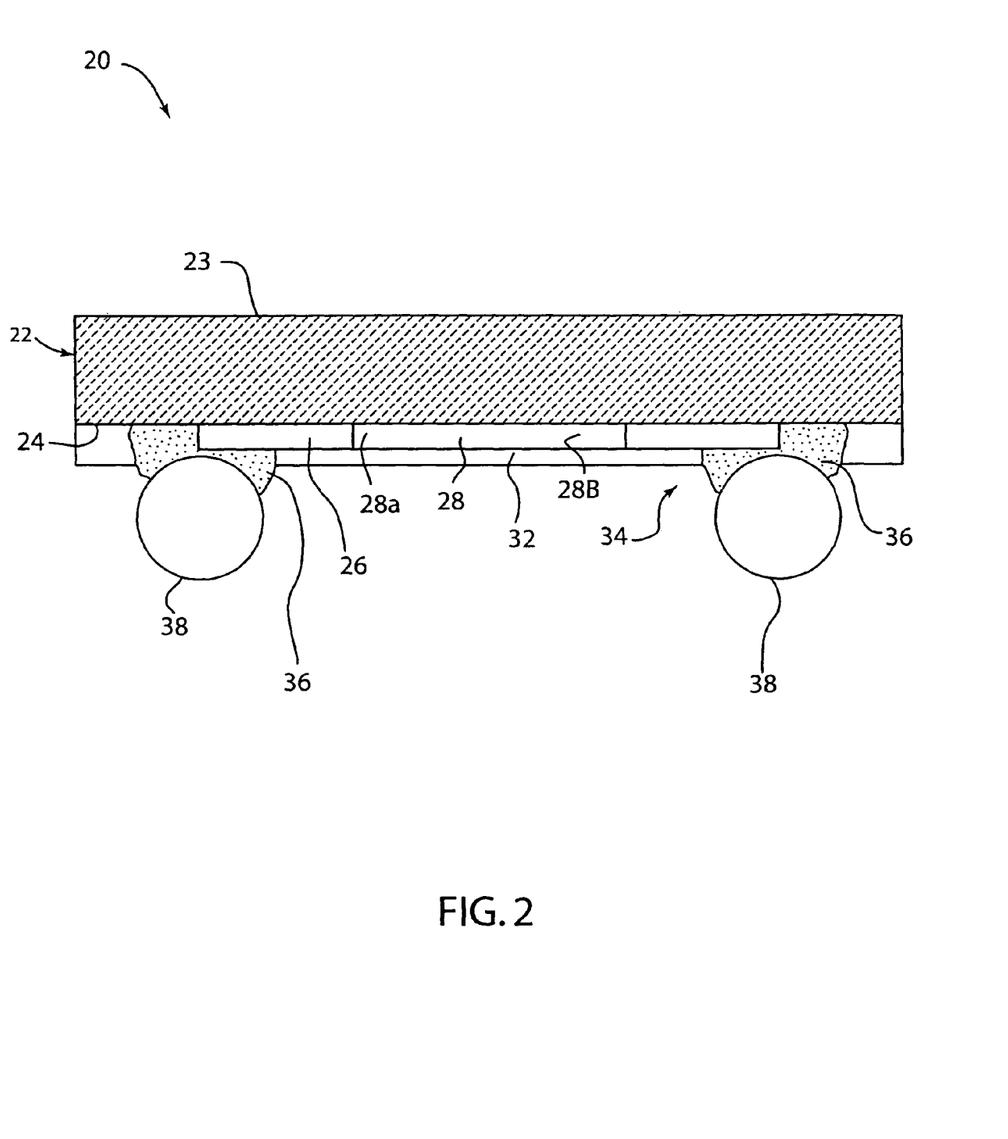
FIG. 2 is a side cross-sectional view of FIG. 1.

Referring to FIGS. 1 and 2, there is a ball grid array package 20 shown. Ball grid array package 20 has a planar substrate 22 having a top surface 23 and a bottom surface 24. Substrate 22 is preferably made out of a ceramic material such as alumina. Other substrates such as printed circuit boards could be used.

A conductor or circuit line 26 is located on bottom surface 24. A circuit component 28 such as a resistor, capacitor, inductor, integrated circuit or other electronic component is shown located on bottom surface 24. For this example, circuit component 28 will be assumed to be a resistor. Circuit component 28 has a first end 28A and a second end 28B. The conductors and resistors would be formed using conventional thick film processing techniques. The conductors 26 and circuit components 28 slightly overlap and sinter to form a mechanical and electrical bond during processing.

A cover coat 32 is placed over the surface 24, component 28 and conductor 26. The cover coat has holes 34. The cover coat prevents soldering of the conductors and helps to protect from corrosion and abrasion.

A conductive epoxy 36 is located in hole 34, covering part of conductor 26 and onto surface 24. The conductive epoxy is a mixture of silver and a polymer that is screened or pressure filled. The preferred conductive epoxy has reducing additives. These additives are also referred to as oxygen scavengers or corrosion inhibitors. The preferred conductive epoxy is commercially available from Emerson and Cuming Corporation of Billerica, Mass. under designation number 8175. A copper ball or sphere 38 is mechanically and electrically attached to the conductors 26 by conductive epoxy 36. Copper balls 38 are commercially available from Bow Electronic Solder Corporation of Sayreville, N.J. The copper ball is placed onto the conductive epoxy and then cured for 1 hour. The copper ball 38 would typically be later mounted to an external electrical circuit such as on a printed circuit board. The reducing additives convert the copper oxides on the surface of ball 38 back to copper at the ball to conductive epoxy interface. This greatly reduces the overall resistance of the electrical connection, especially after thermal cycling. The reducing additives allow the connection to have an acceptable amount of electrical resistance.

The conductive epoxy has to perform 2 functions. First, the conductive epoxy has to have enough mechanical strength to bond with the copper balls to securely retain them during thermal excursions. Second, the conductive epoxy converts the copper oxides on the surface of the ball to copper at the ball to conductive epoxy interface reducing the contact resistance.

After the epoxy has cured, package 20 is dipped into a bath of a molten alloy of tin, silver, copper and antimony (also known as Castin) to coat a thin layer onto the copper balls 38. This alloy layer has several functions. First, the alloy layer prevents oxidation of the balls during storage. Second, the molten alloy bath leaches or removes the outermost silver layer from the conductive epoxy preventing silver migration. The alloy layer does not adhere or cover the conductive epoxy.

Alternatively, after the epoxy has cured, package 20 could be electroplated with tin. The tin layer would also prevent oxidation during storage and silver migration.

Conductive epoxy materials are conductive, flexible, and can be dispensed to form small features. Typically, the conductive epoxy is 2 part system that combines a resin material with a hardener. The resin and hardener are typically pre-mixed and then keep below freezing to prevent the chemical hardening reaction. The preferred resin incorporates a bisphenol-F based resin.

An oxygen scavenger or other type of deoxidizer may be added to improve the connection to the copper ball during curing. The oxygen scavengers inhibit electrochemical corrosion. The oxygen scavenger should not leave any residue after curing. Possible oxygen scavengers include abietic acid, adipic acid, ascorbic acid, acrylic acid, citric acid, maleic acid, polyacrylic acid, or other organic acids with an electron-withdrawing group such as fluorine, chlorine, bromine, iodine, sulfur, nitrile, hydroxyl, or benzyl groups.

A corrosion inhibitor is also incorporated into the preferred conductive epoxy. The corrosion inhibitors prevent the onset of corrosion by the use of a chelating agent.

The conductive portion of the conductive epoxy is made up of silver flakes. Silver flakes are formed by mechanically flattening silver particles in a press to produce a powder containing a high ratio of flakes to particles. The particles may be suspended in an expanding air flow to categorize them by air resistance. Then the air-resistance categorized particles are sorted by size to separate flakes from much smaller compact particles. The silver flakes are mixed into the resin until sufficient to form a conductive material during subsequent curing.

Silver flakes have a very low percolation threshold at which time the material switches from a high-resistance material to a very low-resistance material. The theoretical percolation threshold for silver flakes that are three times as wide as they are thick is only about 16% by volume (about 25% by weight). More preferably, the conductive epoxy has as many particles as allowed for screening. The preferred range is about 60 to about 90% silver flakes by weight, more preferably about 70% silver flakes. Preferably, the average width of the flakes is at least two times and more preferably three times the average thickness of the flakes.

Ball grid array package 20 is assembled by the following process sequence: The conductors 26 are screened onto surface 24 and fired in an oven. The circuit components 28 are screened onto surface 24 and fired in an oven. Cover coat 32 is screened on and cured. Conductive epoxy 36 is then screened through a mask onto conductors 26 through hole 34. Copper balls 38 are placed onto the conductive epoxy and cured for 1 hour at 150 degrees Celsius. Next, copper balls 38 are dipped into the molten alloy of tin, silver, copper and antimony. Finally, the assembly 20 is electrically tested.

The ball grid array package 20 has many advantages. Since, conductive epoxy is very compliant and flexible. The ball pads of the prior art can be eliminated while still maintaining good thermal cycle life and obtaining a more dense package. Ball grid array package 20 allows a substrate without holes to be used resulting in a lower cost package. Ball grid array package 20 does not contain any lead resulting in a lead free package that is environmentally friendly.

$1^{st}$ Alternative Embodiment

Figure 3:
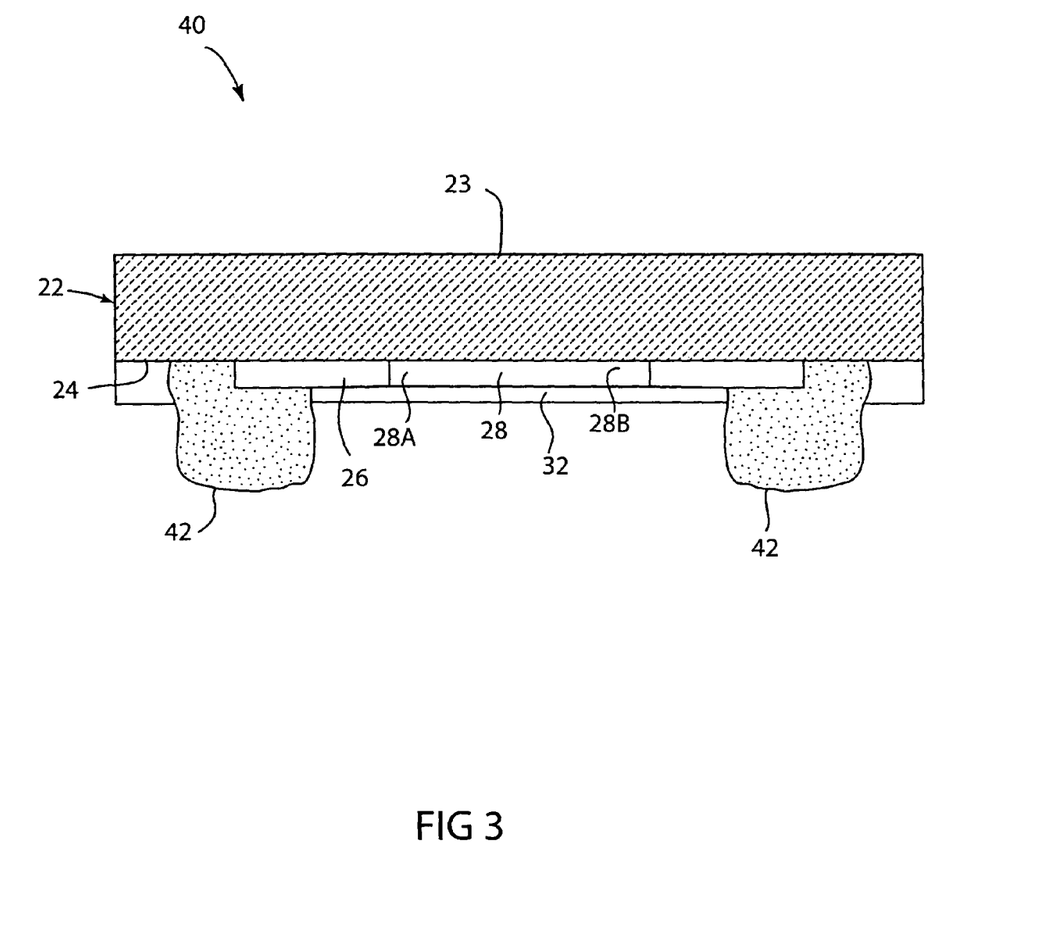
FIG. 3 is a side cross-sectional view of an alternative embodiment of a ball grid array package.

FIG. 3 shows a side cross-sectional view of an alternative embodiment of a ball grid array package. Ball grid array package 40 is similar to ball grid array package 20. The copper ball 38 of package 20 has been replaced with a bump 42 formed of conductive epoxy. The previous two step process of dispensing conductive epoxy and placing a copper ball has been simplified to just dispensing enough conductive epoxy to form a bump. The overall resistance of the connection using a conductive epoxy bump will be higher than that using the copper ball and epoxy in combination. The conductive epoxy used to form bump 42 will have an increased viscosity to help hold its shape after it has been placed but before it has been cured.

$2^{nd}$ Alternative Embodiment

Figure 4:
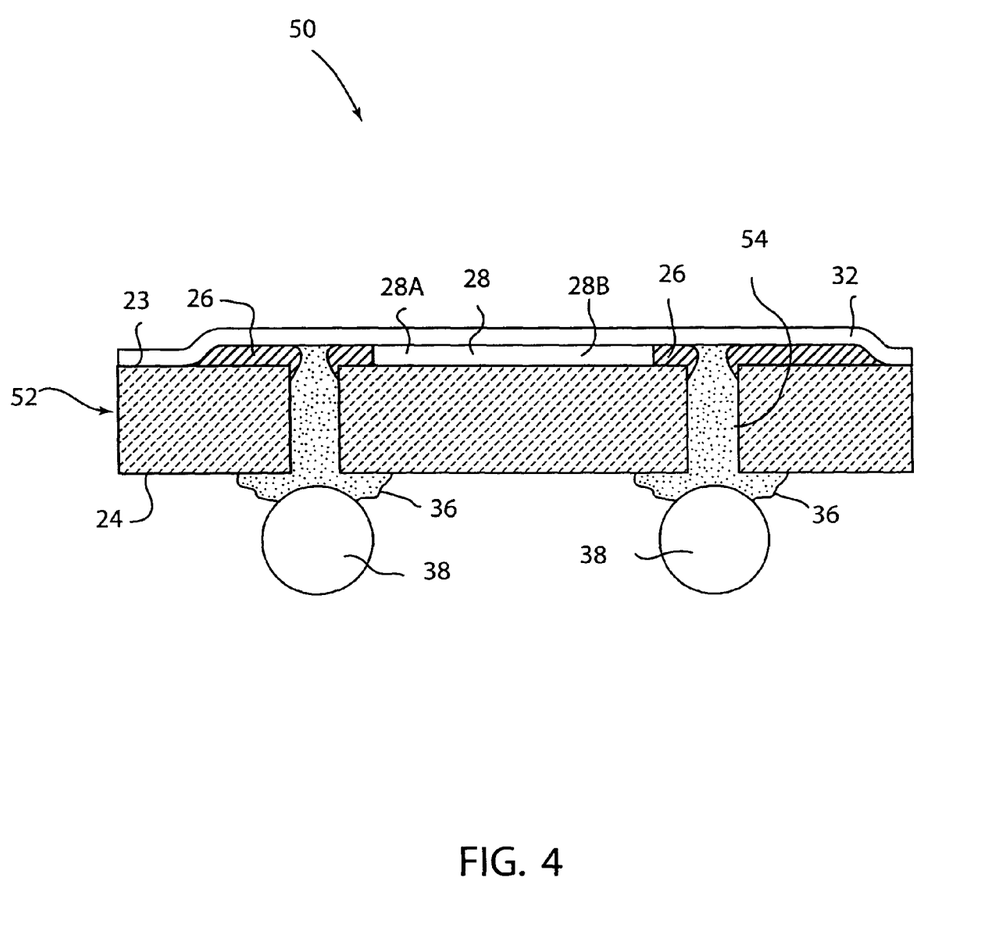
FIG. 4 is a side cross-sectional view of an alternative embodiment of a ball grid array package.

Turning now to FIG. 4, a side cross-sectional view of another embodiment of a ball grid array package is shown. Ball grid array package 50 has a substrate 52 with an array of cylindrical holes or vias 54 formed therein and which extend through substrate 52 between top surface 23 and bottom surface 24.

A conductor or circuit line 26 is located on top surface 23. A circuit component 28 such as a resistor, capacitor, inductor, integrated circuit or other electronic component is also located on surface 23. For this example, circuit component 28 will be assumed to be a resistor. Circuit component 28 has a first end 28A and a second end 28B. The conductors and resistors would be formed using conventional thick film processing techniques. The conductors 26 and circuit components 28 slightly overlap and sinter to form a mechanical and electrical bond during processing. Conductor 26 slightly extends into holes 54.

A cover coat 32 is placed over the surface 23, component 28 and conductor 26. The cover coat prevents soldering of the conductors and helps to protect from corrosion and abrasion.

The holes or vias 54 are filled with conductive epoxy 36. The conductive epoxy is a mixture of silver and a polymer that is screened or pressure filled into vias 54. The preferred conductive epoxy has reducing additives. The conductive epoxy extends slightly beyond bottom surface 24. A copper ball or sphere 38 is mechanically and electrically attached with conductive epoxy 36. The copper ball is placed onto the conductive epoxy and then cured for 1 hour. The copper ball 38 would typically be later mounted to an external electrical circuit such as on a printed circuit board. The reducing additives convert the copper oxides on the surface of ball 38 back to copper at the ball to conductive epoxy interface. This greatly reduces the overall resistance of the electrical connection. The reducing additives allow the connection to have an acceptable amount of electrical resistance. After the epoxy has cured, package 50 is dipped into a molten bath of Castin alloy to coat balls 38. This alloy layer prevents oxidation during storage.

Figure 5:
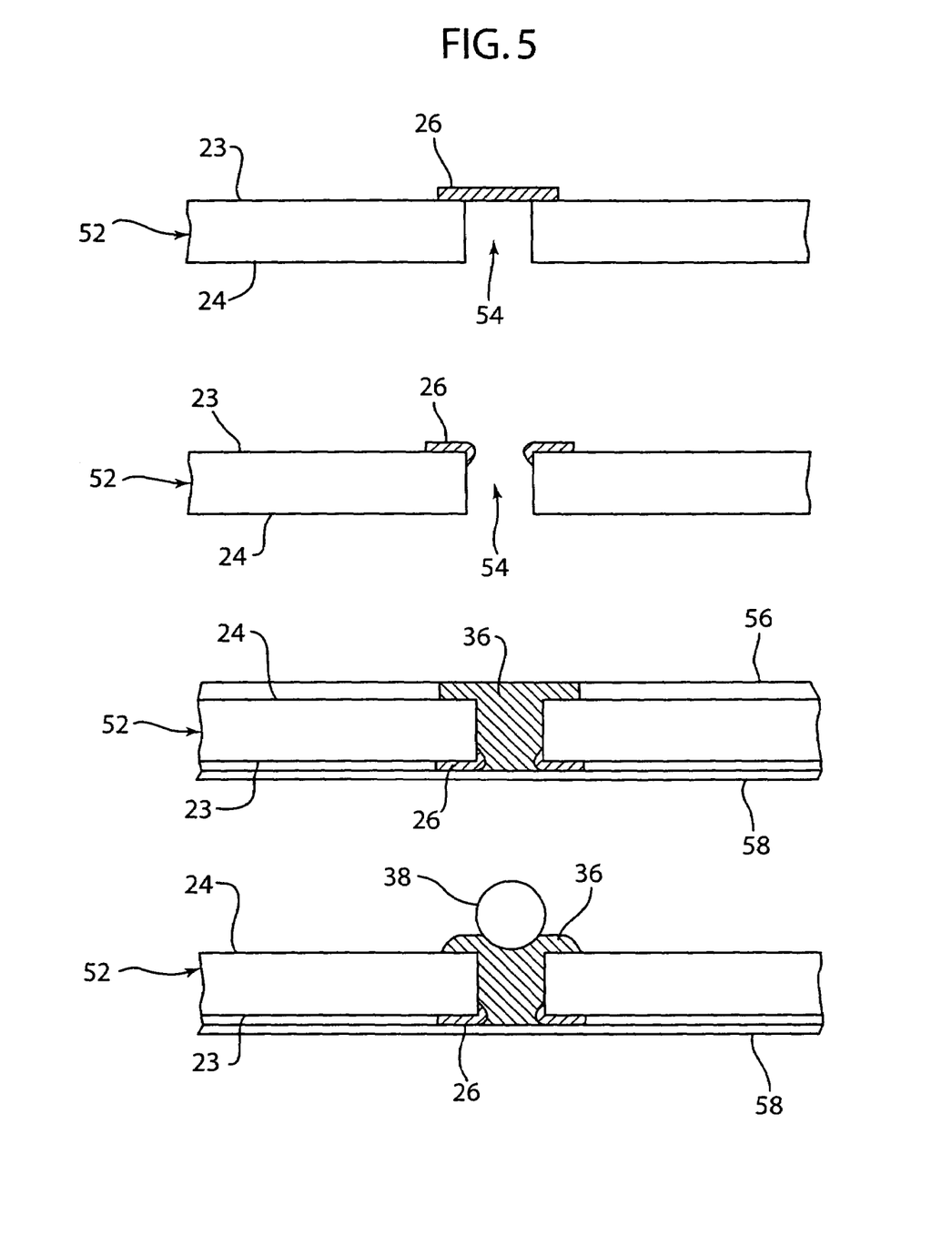
FIG. 5 shows a method of manufacturing the ball gird array package of FIG. 4.

Referring to FIG. 5, a method of making ball grid array package 50 is shown. The conductors 26 are screened onto surface 23 and fired in an oven. Conductor 26 slightly covers the inside of hole 54 as shown in the second drawing from the top. If desired, the circuit components and cover coat could be added at this point by screening and firing. The third drawing from the top shows that substrate 52 has been turned over placed onto a plate 58. Plate 58 prevents the conductive epoxy from leaking on surface 23. A mask 56 is placed onto surface 24. Mask 56 has an array of holes that are aligned with holes 54 of substrate 52. The conductive epoxy 36 is then dispensed into hole 54 where it flows into and contacts conductors 26. Mask 56 is removed and copper balls 38 are placed onto the conductive epoxy and cured as shown in the bottom drawing. Next, plate 58 is removed. Next, copper balls 38 are dipped into Castin alloy. Finally, the assembly 50 is electrically tested.

3$^{rd}$ Alternative Embodiment

Figure 6:
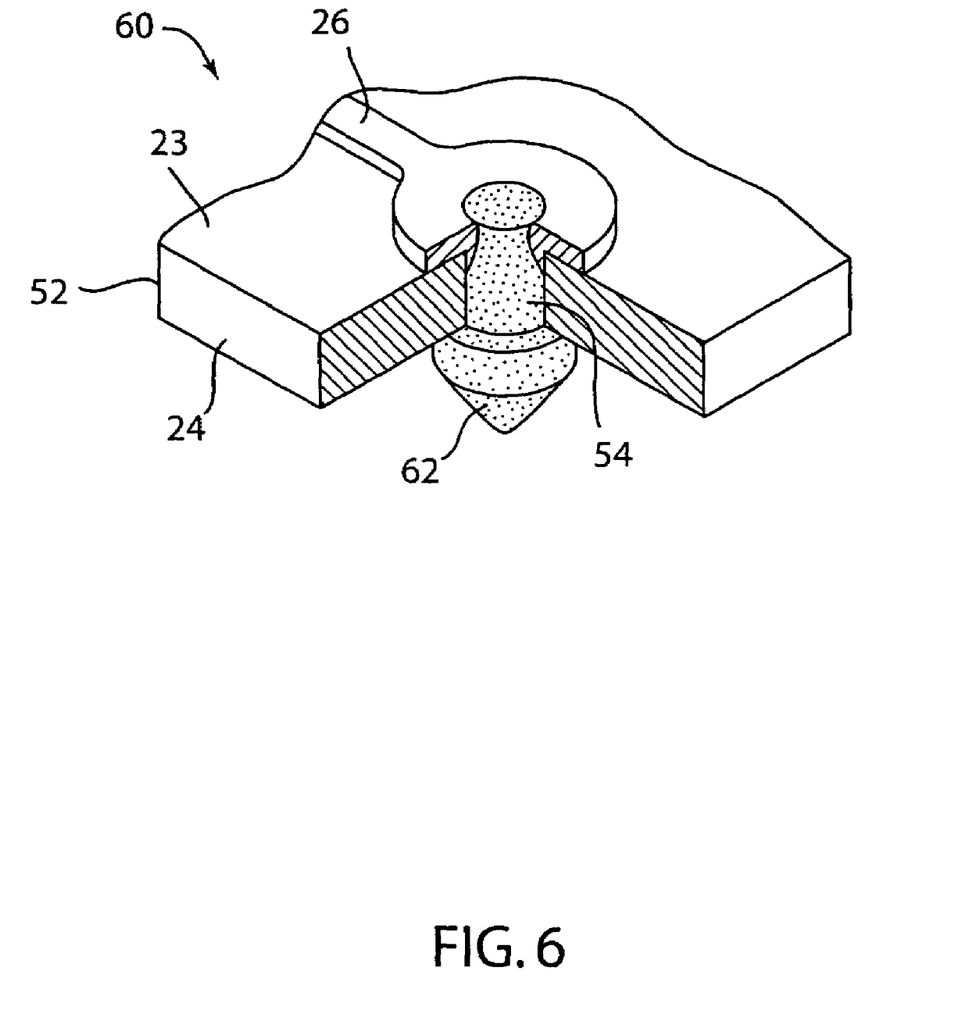
FIG. 6 is a side cross-sectional view of an alternative embodiment of a ball grid array package.
Figure 7:
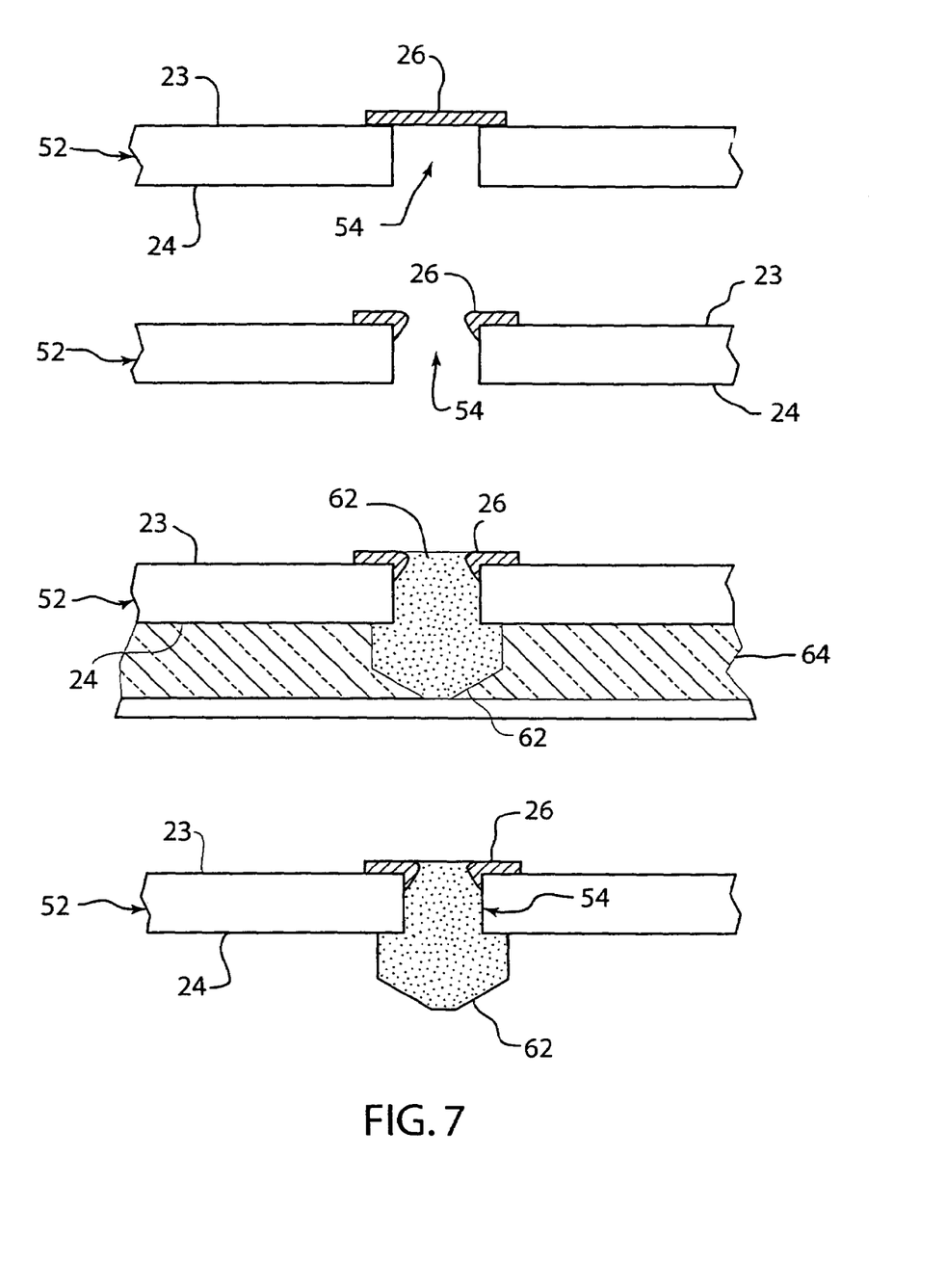
FIG. 7 shows a method of manufacturing the ball gird array package of FIG. 6.

Turning now to FIGS. 6 and 7, a side cross-sectional view of another embodiment of a ball grid array package is shown. Ball grid array package 60 has a substrate 52 with an array of cylindrical holes or vias 54 formed therein and which extend through substrate 52 between top surface 23 and bottom surface 24.

A conductor or circuit line 26 is located on top surface 23. The conductor would be formed using conventional thick film processing techniques. Conductor 26 surrounds and slightly extends into holes 54.

The holes or vias 54 are filled with a cast conductive epoxy 62. The conductive epoxy is a mixture of silver and a polymer that is screened or pressure filled into vias 54. The preferred conductive epoxy has reducing additives. The preferred conductive epoxy is commercially available from Emerson and Cuming Corporation under the designation of 8175. The conductive epoxy is cast into the shape of a bump using a mold 64.

Referring to FIG. 7, a method of making ball grid array package 60 is shown. The conductors 26 are screened onto surface 23 and fired in an oven. Conductor 26 slightly covers the inside of hole 54 as shown in the second drawing from the top. If desired the circuit components and cover coat could be added at this point by screening and firing. The third drawing from the top shows that a mold 64 has been placed against surface 24. Mold 64 has an array of cavities that are aligned with holes 54 of substrate 52. The conductive epoxy 36 is then dispensed into hole 54 from surface 23, where it flows into and contacts conductors 26. If desired, a mask could be used on surface 23 to fill holes 54. After the conductive epoxy has cured, the mold 64 is removed as shown in the bottom drawing leaving cast conductive epoxy 62. Finally, the assembly 60 is electrically tested.

4$^{th}$ Alternative Embodiment

Figure 8:
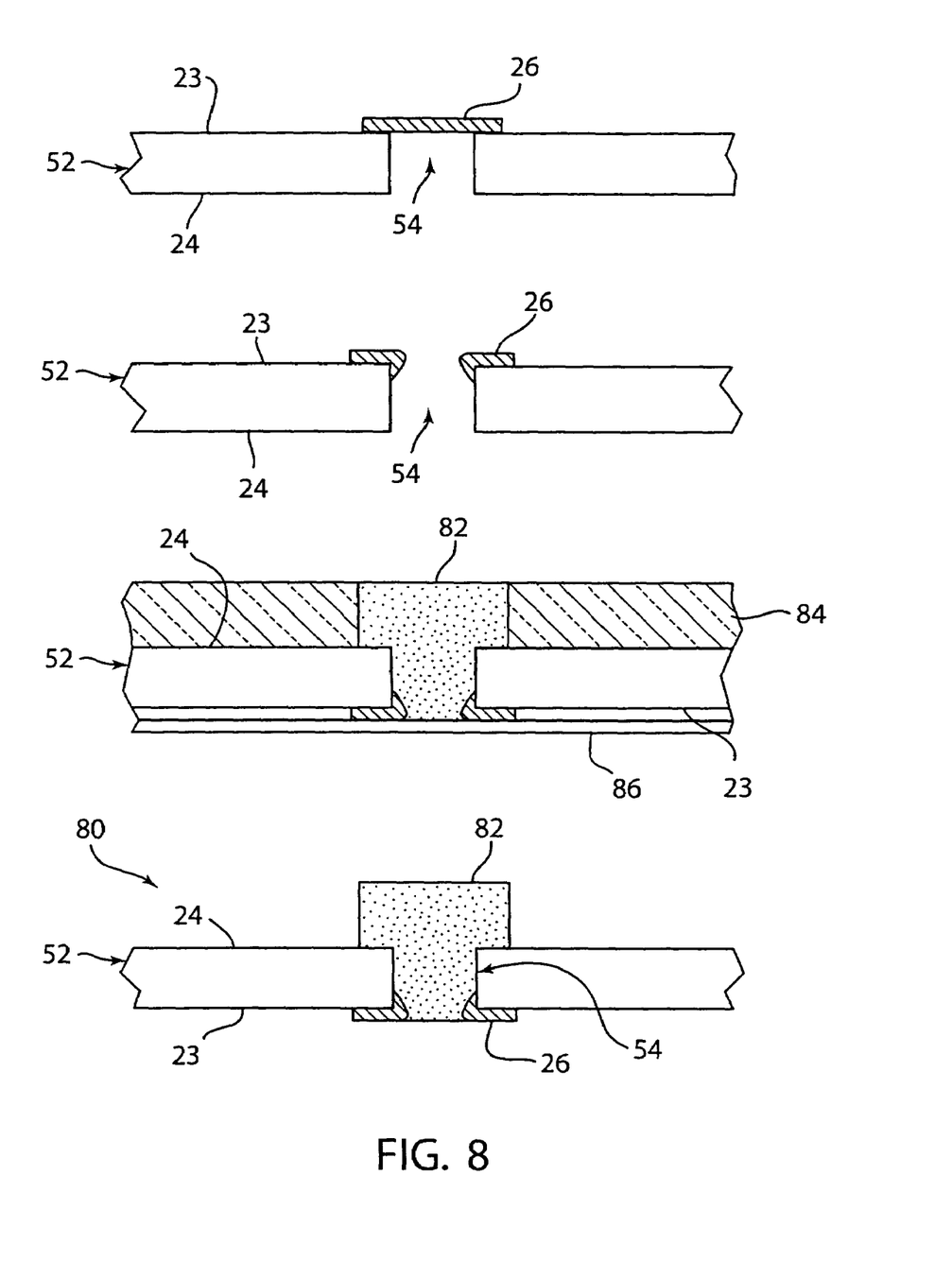
FIG. 8 shows an alternative method of manufacturing the ball gird array package of FIG. 6.

Turning now to FIG. 8, a side cross-sectional view of another embodiment of a ball grid array package is shown. In the bottom drawing, ball grid array package 80 has a substrate 52 with an array of cylindrical holes or vias 54 formed therein and which extend through substrate 52 between top surface 23 and bottom surface 24.

A conductor or circuit line 26 is located on top surface 23. The conductor would be formed using conventional thick film processing techniques. Conductor 26 surrounds and slightly extends into holes 54.

The holes or vias 54 are filled with a cast conductive epoxy 82. The conductive epoxy is a mixture of silver and a polymer that is screened or pressure filled into vias 54. The preferred conductive epoxy has reducing additives. The conductive epoxy is cast into the shape of a bump using a mold 84.

Referring to FIG. 8, a method of making ball grid array package 80 is shown. The conductors 26 are screened onto surface 23 and fired in an oven. Conductor 26 slightly covers the inside of hole 54 as shown in the second drawing from the top. If desired the circuit components and cover coat could be added at this point by screening and firing. The third drawing from the top shows that a mold 84 has been placed against surface 24 and a plate 86 has been placed against surface 23. Mold 84 has an array of cavities that are aligned with holes 54 of substrate 52. The conductive epoxy is then dispensed into mold 84, where it flows into holes 54 and contacts conductors 26. After the conductive epoxy has cured, the mold and plate are removed as shown in the bottom drawing leaving cast conductive epoxy 82. Finally, the assembly 80 is electrically tested.

Thermal Cycle Testing

Several test vehicles were fabricated and tested for thermal cycle performance. The test vehicle has an alumina substrate with a 3 by 16 array of balls that are daisy-chained or interconnected by circuit lines. The balls are attached to conductors on the substrate. Three different ball/adhesive combinations were tested.

1. A 10 percent tin 90 percent lead solder ball was soldered to the conductor with 63 percent tin 37 percent lead solder.
2. A copper ball was attached to the conductor using CE 3102 reducing conductive adhesive from Emerson and Cuming Corporation.
3. A copper ball was attached to the conductor using 8175 reducing conductive adhesive from Emerson and Cuming Corporation.

The test vehicles were cycled from −55 to +125 degrees Celsius in an environmental test chamber. The resistance of the ball to conductor joints was measured and the number of cycles to cause a 60 percent failure of the joints was recorded. The results are shown in the following table.

| Test Vehicle | Number of cycles to 60% failure |
| --- | --- |
| 1. Solder Ball and solder joint | 1500 |
| 2. Copper ball and CE 3102 adhesive | 800 |
| 3. Copper ball and 8175 adhesive | 2700 |

The testing showed that the 8175 conductive adhesive significantly improved the life of the electrical connection. The 8175 conductive adhesive has a higher mechanical strength than the CE 3102 conductive adhesive.

Silver Migration Testing

Several test vehicles were fabricated and tested for silver migration performance. The test vehicle has an alumina substrate with a 3 by 16 array of balls in which the middle row of balls are connected and the outer row of balls are connected in a separate circuit. The balls are attached to conductors on the substrate. A copper ball was attached to the conductor using 8175 reducing conductive adhesive from Emerson and Cuming Corporation. One group of parts was kept as a control and another group was dipped into a molten solder alloy for 30 seconds. The molten alloy coats the copper balls. The molten alloy leaches away silver from the surface of the conductive adhesive but does not adhere to the conductive adhesive.

A bias voltage of 25 volts was applied between the middle and outer rows of the test vehicles. The connections were monitored for shorts over time. The results are shown in the following table.

| Test Vehicle | Number of hours to failure |
| --- | --- |
| 1. No solder alloy dip | 2 |
| 2. Solder alloy dip | 0 after 1000 hours |

The testing showed that the solder alloy coating prevented silver migration from occurring.

Variations of the Invention

One of ordinary skill in the art of making resistors, will realize that there are many different ways of accomplishing the preferred embodiment. For example, although it is contemplated to make substrate 22 out of ceramic, other suitable materials would work, like polyimide or FR4.

Another variation of the invention would be to use other types of balls 38, for example, a plastic ball that is coated with a conductive material could be used.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A ball grid array package comprising:
   a) a ceramic substrate having a first and a second surface, and a plurality of vias extending through the substrate between the first and second surfaces;
   b) a plurality of conductors, located on the first surface, the conductors at least partially surrounding the vias, the conductors each having an opening surrounding the via;
   c) at least one resistor located on the first surface and connected between at least two of the conductors;
   d) a conductive epoxy filling each of the vias and the opening, the conductive epoxy in electrical contact with the conductors, the conductive epoxy further extending onto the second surface such that the conductive epoxy at least partially surrounds each of the vias on the second surface;
   e) a cover coat located over the resistor, the conductors and the conductive epoxy;
   f) a plurality of copper balls located on the second surface, the copper balls attached to the conductive epoxy, the conductive epoxy providing an electrical connection between the conductors and the copper balls; and
   g) a metal alloy covering the copper balls except where the copper balls are attached to the conductive epoxy.

2. The package according to claim 1, wherein the conductive epoxy is a reducing conductive epoxy.

3. The package according to claim 1, wherein the metal alloy is a solder alloy.

4. The package according to claim 1, wherein the metal alloy is castin.

5. A ball grid array package comprising:
   a) a ceramic substrate having a first and a second surface, and a plurality of vias extending through the substrate between the first and second surfaces;
   b) a plurality of conductors, located on the first surface, the conductors at least partially surrounding the vias, the conductors each having an opening;
   c) at least one resistor located on the first surface and connected between at least two of the conductors;
   d) a conductive epoxy filling the vias, the conductive epoxy having a first and second portion associated with each via;
   e) the first portion attached to and in electrical contact with the conductor and extending into the opening;
   f) the second portion extending away from the second surface and surrounding the via on the second surface, the second portion forming a termination bump, the termination bump adapted to make an electrical contact; and
   g) a cover coat located over the resistors, the conductors and the first portion of the conductive epoxy in the openings.

6. The package according to claim 5, wherein the conductive epoxy is a reducing conductive epoxy.

7. A ball grid array package comprising:
   a) a ceramic substrate having a first and a second surface, and a plurality of vias extending through the substrate between the first and second surfaces;
   b) a first conductor and a second conductor mounted on the first surface, the first conductor having a first opening surrounding a first via and the second conductor having a second opening surrounding a second via;
   c) a first resistor mounted on the first surface and having first end and a second end, the first end connected to the first conductor and the second end connected to the second conductor;
   d) a conductive epoxy filling each of the vias and the openings, the conductive epoxy in electrical contact with the conductors, the conductive epoxy further extending onto the second surface such that the conductive epoxy at least partially surrounds each of the vias on the second surface;
   e) a cover coat located over the resistor, the conductors and the conductive epoxy;
   f) a plurality of copper balls mounted on the second surface and extending away from the second surface, the copper balls attached to the conductive epoxy, the conductive epoxy providing an electrical connection between the conductors and the copper balls; and
   g) a metal alloy covering the copper balls except where the copper balls are attached to the conductive epoxy.

8. The package according to claim 7, wherein the conductive epoxy is a reducing conductive epoxy.

9. The package according to claim 7, wherein the metal alloy is a solder alloy.

10. The package according to claim 7, wherein the metal alloy is castin.

* * * * *